United States Patent
King (10) Patent No.: US 6,519,577 B1
(45) Date of Patent: Feb. 11, 2003

(54) DIGITAL SIGNAL FILTER USING WEIGHTLESS NEURAL TECHNIQUES

(75) Inventor: Douglas B. S. King, Warton (GB)

(73) Assignee: BAE Systems plc, Farnborough (GB)

( * ) Notice: Subject to any disclaimer, the term of this patent is extended or adjusted under 35 U.S.C. 154(b) by 0 days.

(21) Appl. No.: 09/371,270

(22) Filed: Aug. 10, 1999

Related U.S. Application Data (63) Continuation of application No. PCT/GB98/03833, filed on Dec. 18, 1998.

(51) Int. Cl.[7] ............................................. G06F 15/18
(52) U.S. Cl. .............................................. 706/41; 706/42
(58) Field of Search ..................................... 706/41, 42

(56) References Cited

U.S. PATENT DOCUMENTS

| | | | |
|---|---|---|---|
| 4,674,125 A | * 6/1987 | Carlson et al. | 382/303 |
| 4,805,129 A | 2/1989 | David | 708/300 |
| 4,868,733 A | 9/1989 | Fujisawa et al. | 707/5 |
| 4,868,773 A | 9/1989 | Coyle et al. | 708/304 |
| 5,029,305 A | 7/1991 | Richardson | 341/159 |
| 5,063,521 A | * 11/1991 | Peterson et al. | 706/34 |
| 5,113,507 A | * 5/1992 | Jaeckel | 711/5 |
| 5,253,330 A | * 10/1993 | Bamacher et al. | 706/42 |
| 5,382,955 A | 1/1995 | Knierim | 341/64 |
| 5,459,466 A | 10/1995 | Knierim et al. | 341/160 |
| 5,854,636 A | * 12/1998 | Watanabe et al. | 345/519 |
| 5,892,962 A | * 4/1999 | Cloutier | 712/6 |
| 5,940,529 A | * 8/1999 | Buckley | 382/155 |
| 5,974,521 A | * 10/1999 | Akerib | 712/11 |
| 6,185,336 B1 | * 2/2001 | Clark et al. | 382/224 |
| 6,205,197 B1 | * 3/2001 | Ananth | 377/16 |

FOREIGN PATENT DOCUMENTS

| | | |
|---|---|---|
| EP | 0 217 009 | 4/1987 |
| EP | 0 221 238 | 5/1987 |
| EP | 0 230 752 | 8/1987 |
| GB | 2 095 067 | 9/1982 |
| GB | 2 223 369 | 4/1990 |
| JP | 5-243911 | 9/1993 |
| JP | 5-243912 | 9/1993 |
| JP | 7-95091 | 4/1995 |
| JP | 7-160796 | 6/1995 |
| JP | 7-109988 | 11/1995 |
| JP | 8-505741 | 6/1996 |
| JP | 2605265 | 2/1997 |
| JP | 2629748 | 4/1997 |
| WO | 94/16499 | 7/1994 |
| WO | WO 94/16499 | 7/1994 |

OTHER PUBLICATIONS

Kennedy et al, "C–NNAp–a parallel Processing Architecture for Binary Neural Networks", IEEE International Conference on Neural Networks, Nov.–Dec. 1995.*

Kim, et al, "Memory Based Processor Array for Artificial Neural Networks", IEEE International Conference on Neural Networks, Jun. 1997.*

* cited by examiner

*Primary Examiner*—George B. Davis
(74) *Attorney, Agent, or Firm*—Nixon & Vanderhye P.C.

(57) ABSTRACT

A number of consecutive samples in unit distance code (here Gray code) are effectively stacked and supplied to respective sum and threshold devices 20 corresponding to each bit position, to determine the bulk property or "generic result" of the consecutive samples. This filtered output is converted back to binary and analogue if required. The digital filter may be used in any of the above applications to "clean" data.

16 Claims, 9 Drawing Sheets

DIGITAL SIGNAL FILTER USING WEIGHTLESS NEURAL TECHNIQUES

This is a continuation of PCT application No. PCT/GB98/03833, filed Dec. 18, 1998, the entire content of which is hereby incorporated by reference in this application.

BACKGROUND OF THE INVENTION

1. Field of the Invention

This invention relates to apparatus and methods for digital filtering of signals, for example to remove shot or impulse of noise on analogue or digital signals.

2. Discussion of Prior Art

Digital filters can be used in many different applications on a wide variety of signals and structures. For example the signal structure may be 1-dimensional, e.g. audio signals, instrumentation signals, etc. It may be 2-dimensional e.g. a video image, a RADAR or sonar image, etc. It may be 3-dimensional such as a representation of a volume, e.g. a volume of air space for Air Traffic Control, or a scanned volume in a 3-dimensional medical imaging technique and so on. Mathematically this technique is applicable to signals of any dimensionality.

SUMMARY OF THE INVENTION

Accordingly, in one aspect, this invention provides a digital filter for filtering a digital signal comprising digital words which comprises:

window defining means for defining a window containing a plurality of digital words around a word to be filtered;

means for supplying bits from corresponding bit positions of words in said window to respective sum and threshold means;

said sum and threshold means being operable to output a preset output bit if the sum of the bits applied to said sum and threshold means passes a preset threshold, and output means for outputting a digital word corresponding to a generic result or filter output represented by the outputs of said sum and threshold means.

The digital data represents a 1-, 2-, 3- or higher dimensional signal structure.

Preferably said means for supplying supplies said bits to a single group of sum and threshold means, thereby to output a serial stream of digital words corresponding to generic outputs.

In a parallel fed arrangement, said means for supplying may supply said bits to a plurality of groups of sum and threshold means, thereby to output a parallel stream of digital words corresponding to generic outputs.

The threshold applied by each of said sum and threshold means may be uniform, or it may be non-uniform or adjustable.

Each of said sum and threshold means may comprise a hierarchy of sum and threshold devices in a layered structure, for example as described in U.S. Pat. No. 6,272,511.

Each of said sum and threshold means may comprise a Hamming value comparator made up of a plurality of bit manipulation cells.

Where required, the digital signal filter may comprise unit Hamming distance code converter means for converting said input digital words into unit Hamming distance code prior to supply to said sum and threshold means, and decoder means for returning the filtered unit Hamming distance code to binary.

Where the digital signal filter is required to filter an analogue signal, it preferably comprises analogue to digital conversion means for converting said analogue signal to digital words for filtering, and digital to analogue conversion means for returning said filtered digital words to an analogue signal after filtering.

Preferably said means for supplying supplies to said sum and threshold means bits from corresponding bit positions of words in said window, including said word to be filtered. Alternatively said means for supplying may supply to said sum and threshold means bits from corresponding bit positions in said window, excluding said word to be filtered.

Preferably, said digital filter includes means for comparing said generic result with said data representing said word to be filtered and for selecting for output said generic result or said word to be filtered on the basis of said comparison. Additionally, said means for comparing may further comprise correlation means for comparing the bits set at each bit position in said generic result and said data representing said word to be filtered, and further sum and threshold means for summing and thresholding the results of said correlation.

Whilst the invention has been described above, it extends to any inventive combination of features set out above or in the following description.

BRIEF DESCRIPTION OF THE DRAWINGS

The invention may be performed in various ways and various embodiments thereof will now be described by way of example only, reference being made to the accompanying drawings, in which.

DETAILED DISCUSSION OF EMBODIMENTS

Before describing the arrangements shown in the Figures, an example of the typical process employed will be described. The digital filters employ a one-, two-, or three-dimensional binary window. The data values surrounding the central point, including the central point, are treated as neural exemplars. The centre point of the window is replaced according to the following mechanistic process:

a) the input data is quantised using 1 to N binary bits;

b) if more than one bit quantisation is used, the data is encoded using unit distance coding such as Gray encoding;

c) a sliding window is moved linearly through the data, performing the following actions:

(i) the digitised and encoded values within the window are applied to N weightless binary neurons;
(ii) a threshold T is applied to the neurons;
(iii) the N bit result is referred to as the Generic result;
(iv) the Generic result is converted from bit-modified Gray to integer;
(v) the converted Generic result is output;
(vi) steps (i) to (v) are repeated for all window positions The binary neurons may be sum and threshold devices of the type described in U.S. Pat. Nos. 6,330,702 or 6,272,511 or U.S. application Ser. No. 09/368,584 and/or utilising thermometer code converters or Hamming value comparators as described in U.S. Pat. No. 6,262,676, the entire contents of these being incorporated herein by reference. These devices receive a weightless binary input and fire, i.e. set an output bit, if the Hamming value, that is the number of bits set at the input to the sum and threshold devices exceeds a preset threshold. The threshold may be input as a weighted or weightless binary value. An important benefit here is that the filtration process is wholly or largely asynchronous.

Figure 1:
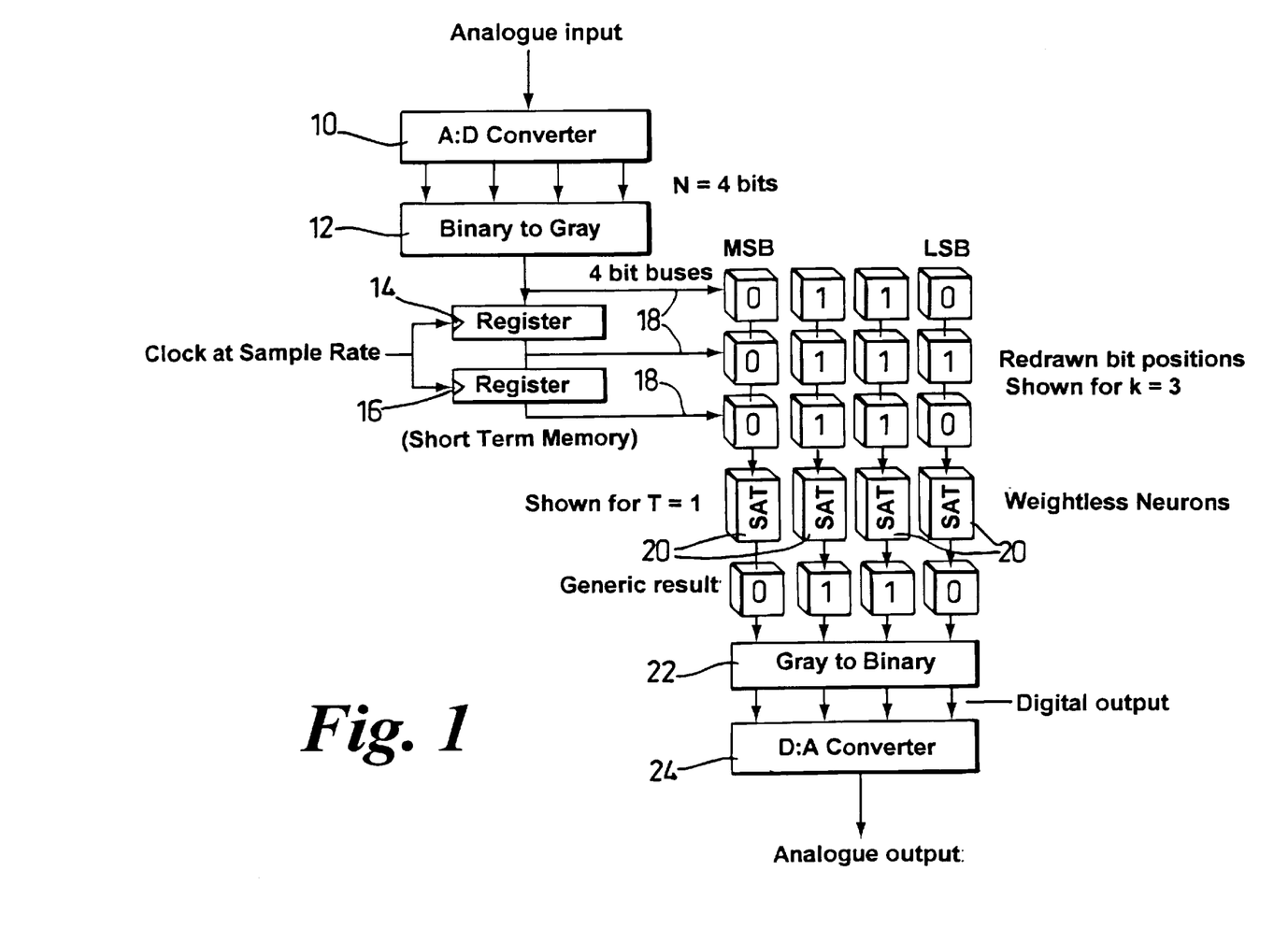
FIG. 1 is a schematic representation of a serial fed one-dimensional weightless neural digital filter for filtering 4-bit data, in accordance with this invention.

Referring now to FIG. 1, this is a schematic representation of a serial fed one-dimensional weightless neural digital filter. The signal filter operates on a binary window of three data samples, where each sample is 4 bits wide. In general the filter may operate on k samples, where k is odd.

When viewing FIG. 1 it should be noted in particular that the bit positions in the data have been redrawn as a 3×4 bit matrix but that this is a diagrammatic representation of the bits and does not signify that there is an array of bit registers.

In the example shown in FIG. 1, a stream of analogue data, e.g. representing an instrumentation signal is quantised by an A to D converter 10 using 4-bits, and then encoded using a Binary to Gray encoder 12. The data then passes to two 4-bit registers 14, 16 which are clocked at the sample rate. The data at the output of the second register 16, that at the output of the first shift register 14, and that at the output of the encoder 12 thus represent three consecutive digital encoded samples of the analogue input data.

These respective outputs are supplied by 4-bit busses 18 to respective 3 input sum and threshold devices 20 which act as weightless neurons, each capable of receiving a respective threshold T, here set to 1. For ease of visualisation the sample data A,B,C is redrawn in rows with the bit positions aligned with the respective sum and threshold devices 20 although in practice each four bit bus would pass respective bits to each of the sum and threshold devices 20, as indicated by the notional redrawn bit positions.

Accordingly, the leftmost sum and threshold device 20 as viewed receives as inputs the most significant bits of A,B,C, etc.

The outputs of the sum and threshold devices 20 collectively provide a generic result which represents the bulk property of the 1-dimensional input signal. Thus, for A=(0110), B=(0111), C=(0110) and T=1, the generic result is shown as (0110). This result is converted back from Gray to binary by a decoder 22 and then returned to analogue by a D to A converter 24. It will be appreciated that as data is clocked sequentially through the filter, it passes through a k sample window (here of 4 bits) which filter the centre bit dependent on the bulk property itself and of neighbouring samples.

Figure 2A:
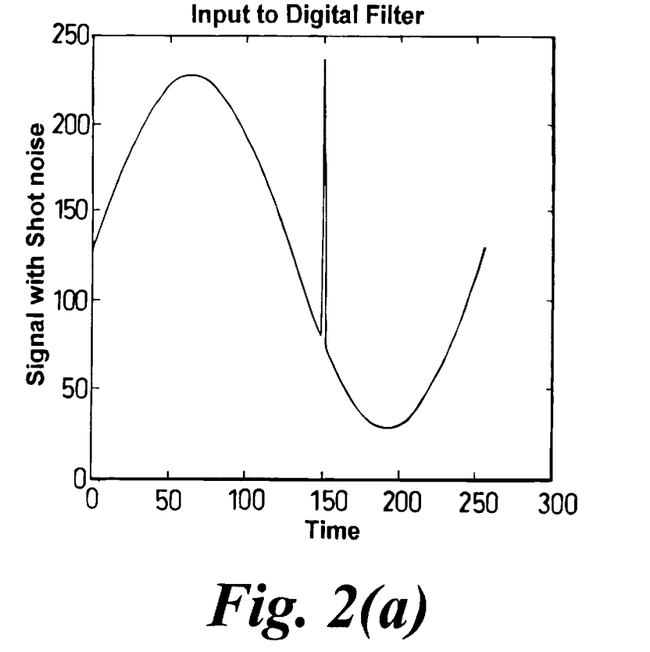
FIGS. 2(a) and 2(b) show an input signal with shot noise and the filtered output signal from a digital signal filter according to FIG. 1.
Figure 2B:
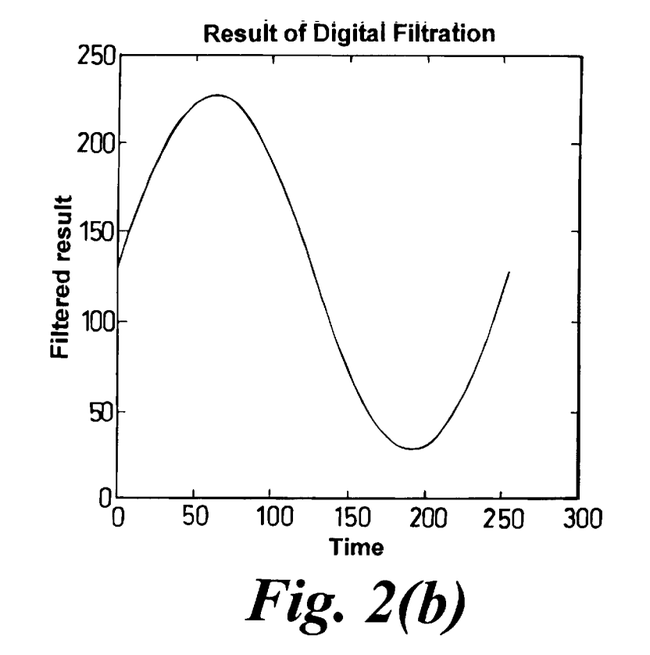

FIGS. 2(a) and 2(b) show the results of digital filtration of a sine wave with shot noise quantised to 8 bits and filtered using a 1 dimensional filter of sample window size k=3. FIG. 2(a) shows the input and FIG. 2 shows the filtered output. It will be noted that the digital filtering has removed the shot noise. Some ripple has been added but this could be reduced by not using all the bits in the filtration process. For example one or more least significant bits may be ignored and passed through unfiltered.

Figure 3:
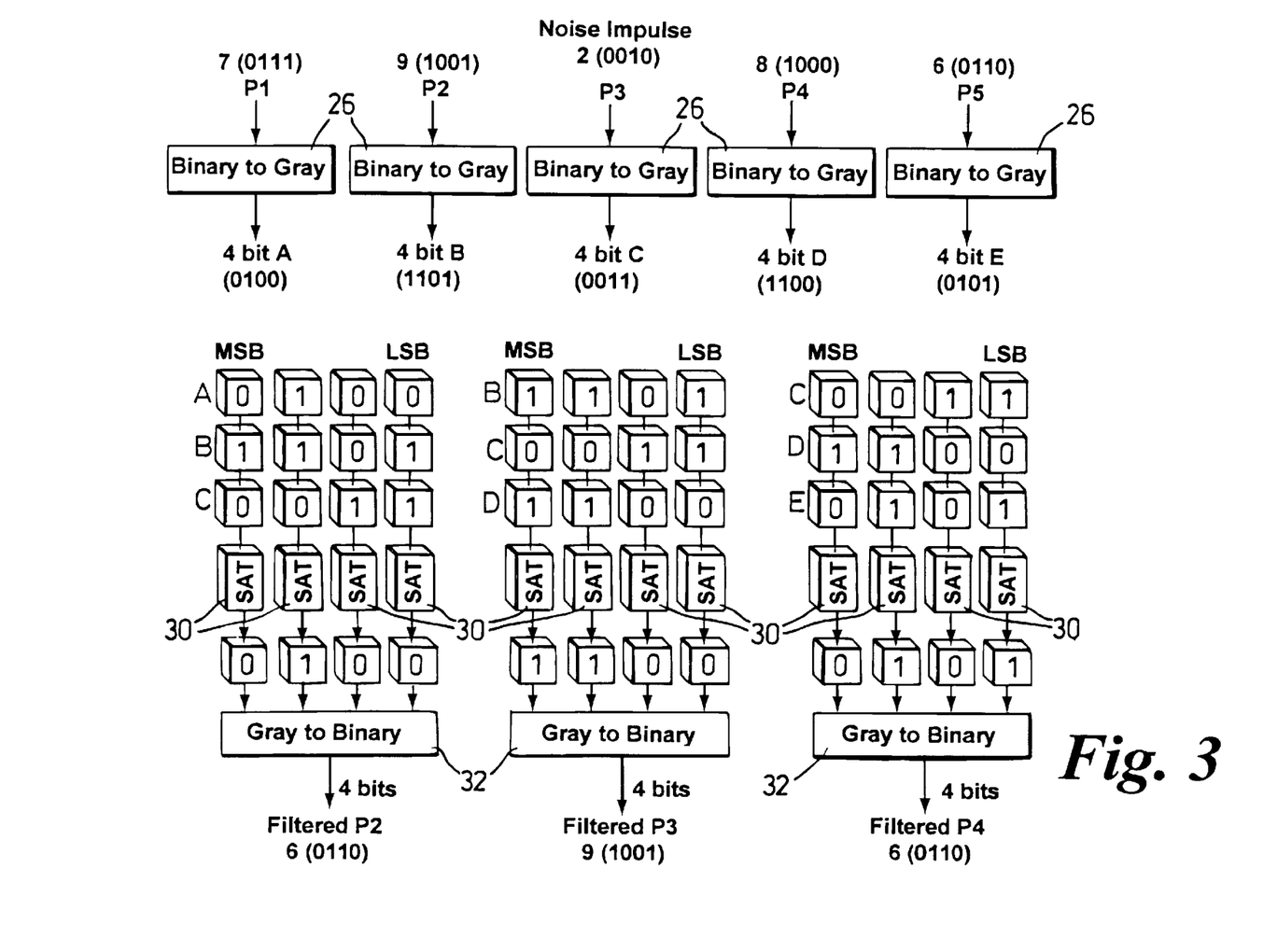
FIG. 3 is a schematic representation of a parallel fed one-dimension weightless neural digital filter for filtering 4-bit data, in accordance with this invention.

FIG. 3 illustrates a one-dimensional parallel weightless neural digital filter for filtering 4-bit data over a window, k, of 3 samples.

Here the digitised 4-bit input data words A,B,C,D,E, etc. are fed in-parallel to five binary to Gray converters 26 and the 4-bit outputs 28 hardwired to an array of twelve three input sum and threshold devices 30 in the permutations identified by the redrawn bit positions. Again these are shown for ease of visualisation only and do not represent bit memories.

The sum and threshold devices 30 may be considered as being arranged in three banks of four, each bank operating (here) on a stack of three Gray converted words. Thus the leftmost bank of sum and threshold devices 30 receive inputs from words A,B,C, the middle bank receives inputs from words B,C,D, and the rightmost bank of sum and threshold devices 30 receive inputs from words C,D,E, as indicated by the re-drawn bit positions. The operation of the sum and threshold directional devices 30 in response to a threshold (here T=1) is as in the previous embodiment, with the output representing the local bulk property of the signal. The outputs of the sum and threshold devices 30 are converted back to binary by decoders 32 to provide filtered points. The decimal input values to the array were (7,9,2,8,6) with the central value deliberately low as if subject to a noise impulse, and the output was (–,6,9,6,–). This small example shows the edge effects of the k=3 window, as P1 and P5 outputs do not exist.

Figure 4:
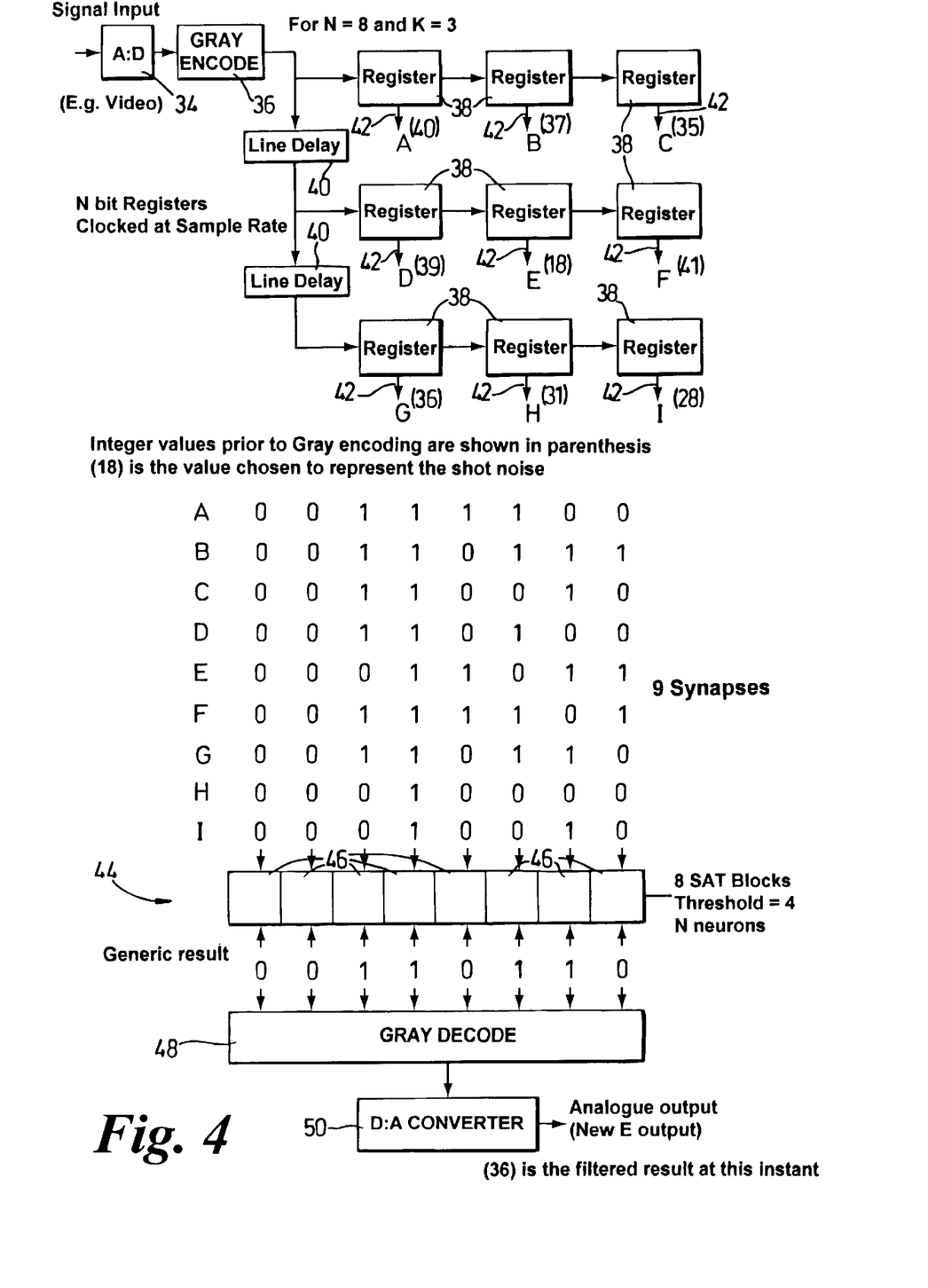
FIG. 4 is a schematic representation of a serial fed two-dimensional digital filter for filtering 8-bit data, in accordance with this invention.

Referring now to FIG. 4, this shows a 2-dimensional filter which processes a 3×3 array (A to I) of 8 bit samples to adjust the value at the centre of the array. In the example shown in the Figure, the centre value E of the array has been given a low value to represent noise. Again the bit positions are redrawn to aid visualisation of the processes implemented by the filter.

A serial analogue input signal representing a 2-dimensional signal e.g. video is supplied to an analogue to digital converter 34 where it is quantised into 8 bits and then Gray encoded by a Gray encoder 36. The 8 bit Gray code is then clocked through a 3×3 array of eight bit registers 38, the rows being separated by line delays 40 so that, effectively, the bit registers and line delays form a 3×3 window which moves over the 2-dimensional signal represented by the input signal. The diagram shows the words A to I at a particular instant, with the decimal integer values prior to encoding shown in parentheses. The outputs of the registers 38 pass via respective 8 bit busses 42 to a bank 44 of eight, 9-input sum and threshold devices 46, each of which in this example is set with a threshold of four. Thus as shown by the redrawn bit position, in this example each sum and threshold device 46 receives 9 bits taken from a respective bit position of each of the values stored in the registers 38. The leftmost sum and threshold device 46 sums and thresholds the most significant bits, and so on.

The outputs of the bank of sum and threshold devices 46 comprise a generic result representing the bulk characteristic of the values in the 3×3 window. The degree of similarity required is set by the value of the threshold. With a threshold of 4, the output bit of the sum and threshold device will only be set if the relevant bit position in the values A to I contain more than four set bits.

The generic result from the sum and threshold devices 46 is then Gray decoded by a decoder 48 and converted back to analogue by a digital to analogue converter 50. With the instant values in the example, the filtered result for E is 36; the unfiltered result was 18.

The serial-fed arrangement of FIG. 4 could also be re-configured to run on parallel fed data, using similar techniques to those implemented in FIG. 3.

Figure 5:
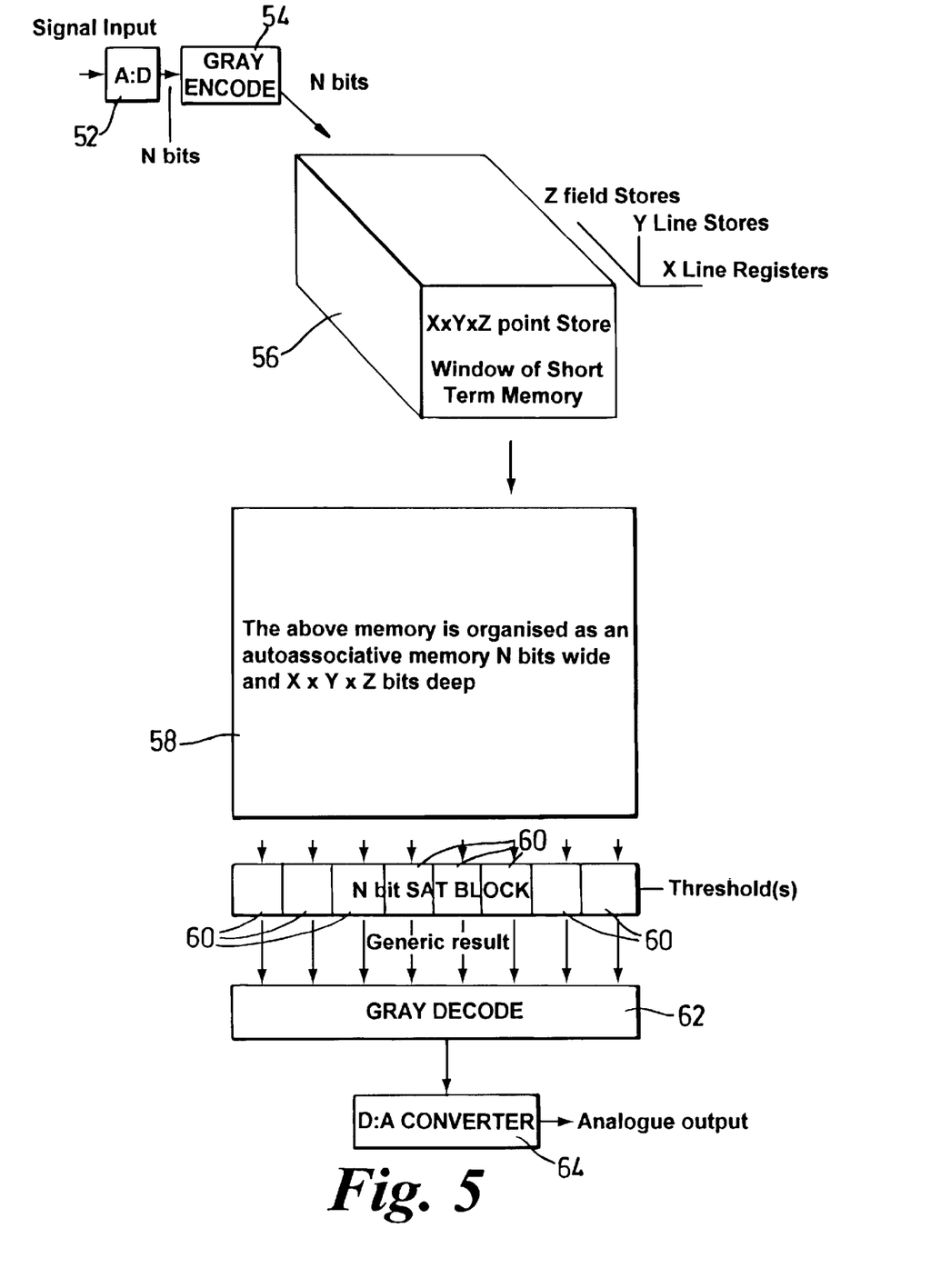
FIG. 5 is a schematic representation of a serial fed three dimensional digital filter for filtering N-bit data, in accordance with the invention.

FIG. 5 is a schematic representation of a serial fed three dimensional digital signal filter for filtering N-bit data, e.g. in a volume representing air space to remove noise. Here data is supplied in a serial stream to an analogue to digital converter 52 where it is quantised to N bits (e.g. 8 bits), and then Gray encoded at an encoder 54 and supplied to a store representing a three dimensional short term memory 56 of X×Y×Z points (X,Y,Z typically being 3,5, or 7), through which the Gray coded data streams through the store to provide the effect of an X×Y×Z three dimensional window moving progressively through the data space, with each point 8 bits wide. The overall data space may be visualised as a stack of two dimensional images representing an air space, or representing successive computer aided tomography images, together composing a three dimensional image. Each 2 dimensional image comprises line registers in the X direction, and line stores in the Y direction. Successive 2 dimensional images are stored in field stores in the Z direction. As in the previous embodiments, the arrangement and mapping of data between the input stores is shown figuratively to aid visualisation. Thus, as indicated at 58, the short term memory 56 is organised as an autoassociative memory, that is one which relies on self similarity of the data rather than ordering it, so that the bulk characteristics of the data may be extracted easily. The data for the memory is then supplied to a bank or block of N sum and threshold devices 60. As in the 1 dimensional and 2 dimensional digital filters, each sum and threshold device 60 receives inputs from a respective bit position from all the data in the window, and so in this example each sum and threshold device 58 receives X×Y×Z bits (typically 27, 125 or 343 bits). If X×Y×Z is very large, it would be possible to have a hierarchy of sum and threshold devices, and the novel architecture described in U.S. Pat. No. 6,272,511 could be used.

The output of the sum and threshold devices comprises a generic result as previously described. It is emphasised that this filtering may be achieved largely or wholly asynchronously and also that it is achieved without using multiply, divide, subtract or accumulate arithmetic functions. It can be shown that, for a nine element integer array [40, 37, 35, 39, 18, 41, 36, 31, 38] containing similar values and one arbitrally chosen noise value, 18, in the middle of the array, the mean and standard deviation are 33.89 and 7.29 respectively, showing a high standard deviation. Using the digital filter of FIG. 4, and a threshold of 4, the result, as indicated above, is 36. This gives a mean of 35.89 and a much reduced standard deviation of 4.20 after digital filtering which is then Gray decoded by a decoder 62, and then returned to analogue form by a digital to analogue converter 64.

The sum and threshold devices in the above embodiments may be selected from the Hamming value comparators, thermometer code converters and other sum and threshold devices described in the U.S. patents and application referred to above, or they may be any other form of sum and threshold device.

In the above embodiments, N bits of digital quantisation can be applied to each point in the signal space. If more than one bit is used the data should be Gray or Thermometer encoded. Indeed any Unit Hamming Distance: code may be used.

The filters employ N sum and threshold devices acting as weightless neurons with k (1D), $k_1 \times k_2$ (2D), $k_1 \times k_{2 \times k3}$ (3D), etc. synaptic inputs and threshold T. The threshold, T, can be a constant or a variable. It can vary between neurons. Not all of the N bits need be used in the filtration process. It may, for instance, be advantageous to ignore one or more least significant bits and pass them through unfiltered.

The thresholds and bit width contributions can be determined by human intervention or by a closed loop optimisation technique. If there exists a 'good' known signal exemplar it is possible to correlate with it the filtered 'bad' signal. Then, simply, the filter characteristics are modified until the highest correlation score is achieved.

If a 'good' signal is not known then it may be possible for a 'bad' signal to be laboriously corrected by human intervention and then used as a 'good' signal to train the neural filter for use with many 'bad' signals. This could be applicable to the restoration of old scratch damaged film stock and old audio recordings, etc.

In the above examples of digital filter, a window of data around a focal point and including the point is processed to determine a generic result representing the bulk properties of the vicinity and the value at the focal point is replaced by the generic result. As a variation of this technique, the window of data, but now excluding the focal point, may be processed to determine a generic result representing the bulk properties of the vicinity which is then compared with the actual value of the point and used to S replace the focal point if the focal point does not match the generic result to a required degree, determined by a second threshold $T_2$. As previously, the filter processes the data and employs a block or bank of sum and threshold devices with one such device for each bit position of the quantised data. The window size determines the number of exemplars used and thus the number of inputs for each sum and threshold device. In a one dimensional case with a window of k samples (k−1) exemplars are used, and so each sum and threshold device has (k−1) inputs. In the two and three dimensional cases window sizes are $(k_1 \times k_2)$ and $(k_{1 \times k2} \times k_3)$ respectively and so $((k_1 \times k_2)-1)$ and $((k_{1 \times k2} \times k_3)-1)$ inputs are required respectively. The threshold $T_1$, for each sum and threshold device can be a constant or a variable and, in the example below, is a constant value ($T_1=4$) for a 3×3 window and 8 exemplars. The exemplars are equivalent to data impinging synapses and the sum and threshold devices are equivalent to neurons and referred to as such.

Figure 6:
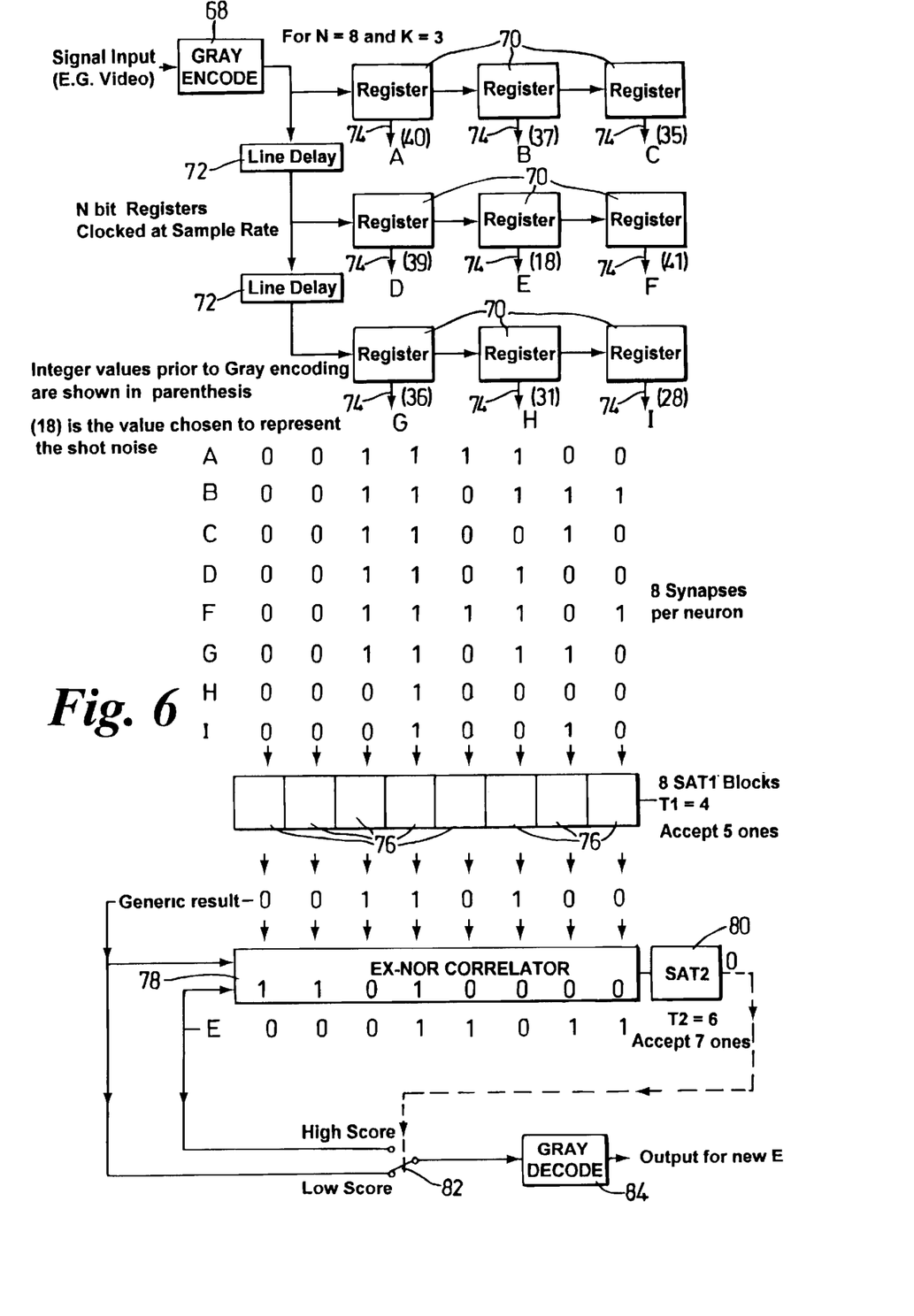
FIG. 6 is a schematic representation of an embodiment of a serial fed two dimensional weightless neural digital filter for filtering 8-bit data, in accordance with this invention, and FIGS. 7(a), 7(b), and 7(c) the Figures showing an original reference image, the image with noise added, and the image of 7(b) as filtered by the digital signal filter of FIG. 6.

Referring now in detail to FIG. 6, the 2-dimensional filter processes a 3×3 array (A to I) of 8 bit samples to filter the value at the centre of the array. A serial analogue input signal e.g. video is supplied to an analogue to digital converter (not shown), where it is quantised into 8 bits and then Gray encoded by a coder 68. The data is then clocked into a 3×3 array of 8 bit registers 70, the registers being arranged in rows of 3 separated by line delays 72. The bits from all the registers except the central one are supplied by respective 8 bit busses 74 to a block of eight sum and threshold devices 76 each corresponding to a bit position of the exemplars or synapses A to D and F to I. Each sum and threshold device has an associated threshold value $T_1$ which here is 4 for all the devices. The threshold $T_1$ defines how many bit differences are acceptable. As previously described the outputs of the sum and threshold devices 76 represents a generic result, but this time excludes the centre point E. The generic result is fed to an EX-NOR correlator block 78 where it is compared to the actual value of E at each of the bit positions. The output of each correlator in the block is supplied as an input to an eight input second sum and threshold device 80 which sums the inputs and compares them with a second threshold $T_2$ (here $T_2$=6). The second threshold determines how close the central point E must be to the generic result for it to avoid being replaced by the generic result in the filtered output. This is achieved by using the output of the second sum and threshold device 80 to control a switch 82 to select either the generic result or the actual value of E, dependent on the result of the comparison. The output is then returned to binary code by a decoder 84, to provide the filtered output for E.

Figure 7A:
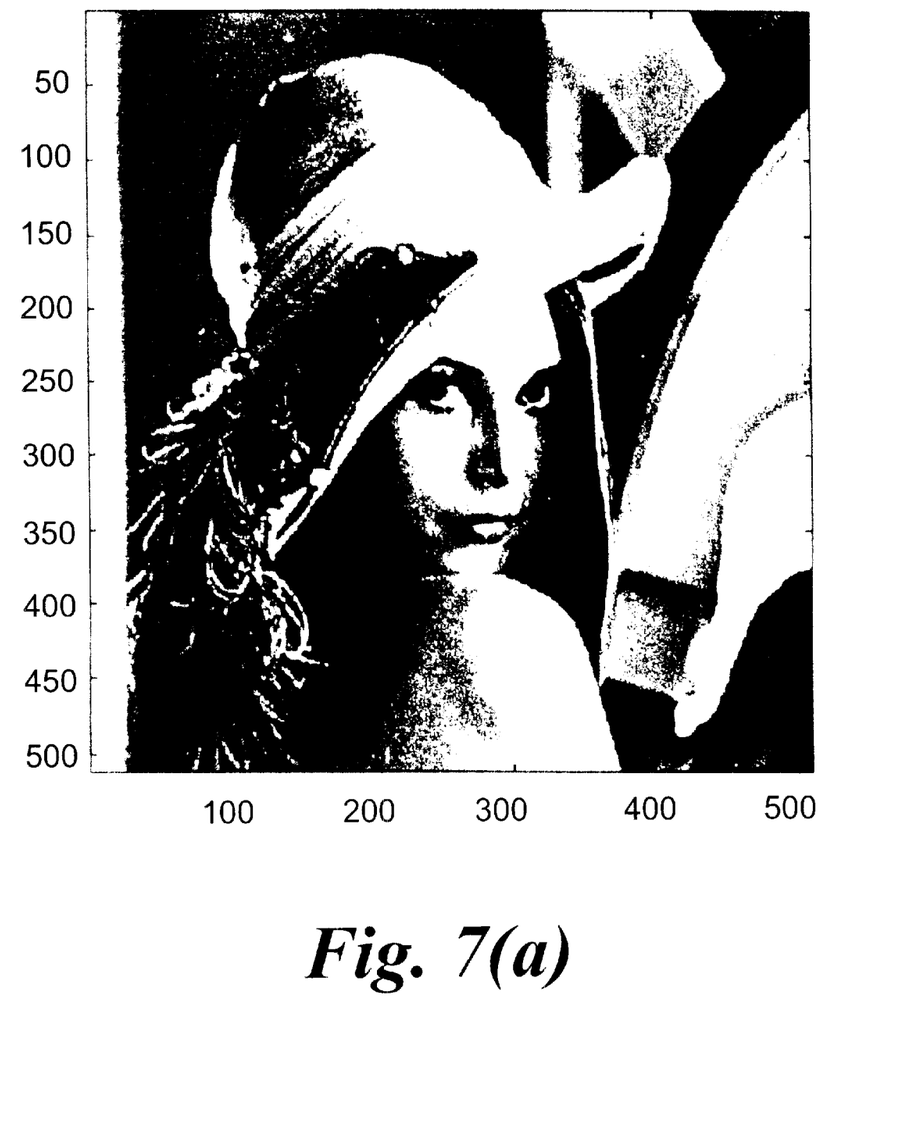
Figure 7B:
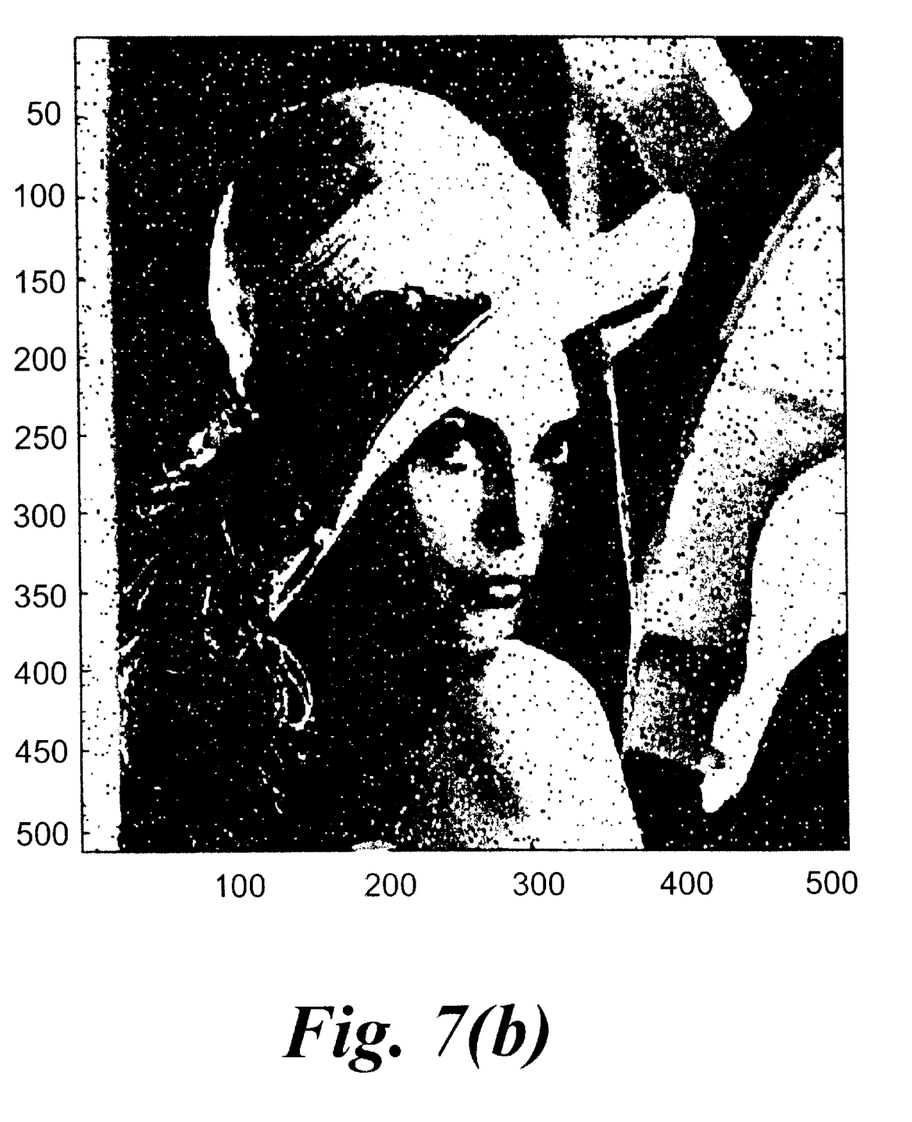
Figure 7C:
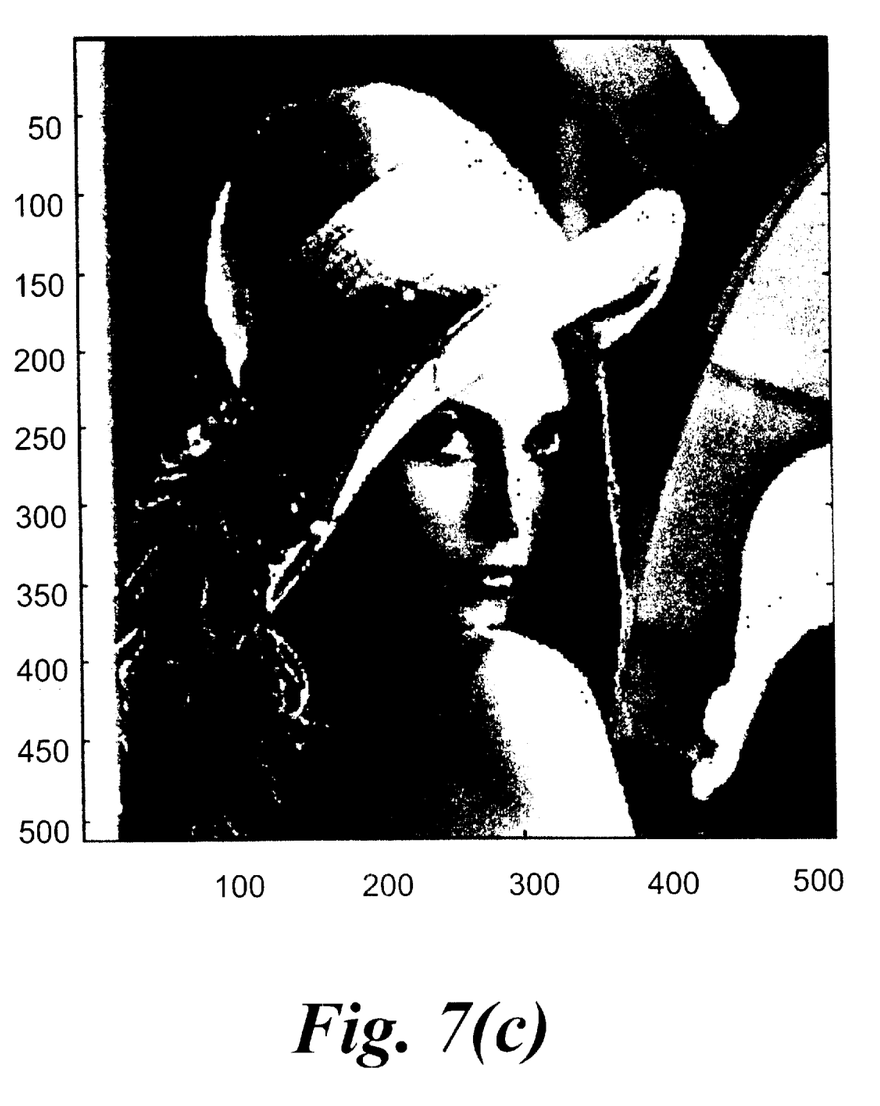

To illustrate the filtering effect of the digital signal filter of FIG. 6, FIG. 7(*a*) shows an original reference image. FIG. 7(*b*) shows the image with noise added, and FIG. 7(*c*) shows the image as filtered by the digital signal filter of FIG. 6.

In general, the implementation of the above arrangement is technology independent; electronic, ionic, magnetic, or electromagnetic (e.g. optical) implementations are all suitable.

What is claimed is:

1. A digital filter for filtering a digital signal comprising digital words which comprises:

window defining means for defining a window containing a plurality of digital words around a word to be filtered;

means for supplying bits from corresponding bit positions of words in said window to respective sum and threshold means, said sum and threshold means being operable to output a preset output bit if the sum of the bits applied to said sum and threshold means passes a preset threshold; and output means for outputting a digital word corresponding to a generic result or filter output represented by the outputs of said sum and threshold means.

2. A digital filter according to claim 1, wherein said digital data represents a 1-dimensional signal structure.

3. A digital filter according to claim 1, wherein said digital data represents a 2-dimensional signal structure.

4. A digital filter according to claim 1, wherein said digital data represents a 3-dimensional or higher dimensional signal structure.

5. A digital filter according to claim 1, wherein said means for supplying supplies said bits to a single group of sum and threshold means, thereby to output a serial stream of digital words corresponding to generic outputs.

6. A digital filter according to claim 1, wherein said means for supplying supplies said bits to a plurality of groups of sum and threshold means, thereby to output a parallel stream of digital words corresponding to generic outputs.

7. A digital filter according to claim 1, wherein the threshold applied by each of said sum and threshold means is uniform.

8. A digital filter according to claim 1, wherein the threshold supplied by each of said sum and threshold devices is non-uniform, or adjustable.

9. A digital filter according to claim 1, wherein each of said sum and threshold means comprises a hierarchy of sum and threshold devices in a layered structure.

10. A digital filter according to claim 1, wherein each of said sum and threshold means comprises a Hamming value comparator made up of a plurality of bit manipulation cells.

11. A digital signal filter according to claim 1, further including:

unit Hamming distance code converter means for converting said input digital words into unit Hamming distance code prior to supply to said sum and threshold means; and decoder means for returning the filtered unit Hamming distance code to binary.

12. A digital signal filter according to claim 1, further including:

analogue to digital conversion means for converting said analogue signal to digital words for filtering; and digital to analogue conversion means for returning said filtered digital words to an analogue signal after filtering.

13. A digital filter according to claim 1, wherein said means for supplying supplies to said sum and threshold means bits from corresponding bit positions of words in said window, including said word to be filtered.

14. A digital filter according to claim 1, wherein said means for supplying supplies to said sum and threshold means bits from corresponding bit positions in said window, excluding said word to be filtered.

15. A digital filter according to claim 1, further including means for comparing said generic result with said data representing said word to be filtered and for selecting for output said generic result or said word to be filtered on the basis of said comparison.

16. A digital filter according to claim 15, wherein said means for comparing comprises correlation means for comparing the bits set at each bit position in said generic result and said data representing said word to be filtered, and further sum and threshold means for summing and thresholding the results of said correlation.

\* \* \* \* \*